(12) United States Patent
Tanaka

(10) Patent No.: US 7,323,749 B2
(45) Date of Patent: Jan. 29, 2008

(54) SEMICONDUCTOR DEVICE COMPRISING AN INTEGRATED CIRCUIT

(75) Inventor: Kazuaki Tanaka, Barcelona (ES)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/354,343

(22) Filed: Feb. 14, 2006

(65) Prior Publication Data

US 2006/0273395 A1 Dec. 7, 2006

(30) Foreign Application Priority Data

Feb. 14, 2005 (EP) .................................. 05075359

(51) Int. Cl.
*H01L 27/01* (2006.01)

(52) U.S. Cl. ................. 257/350; 257/532; 257/536; 257/E27.016

(58) Field of Classification Search ............... 257/347, 257/350, 528, 532, 533, 536, 543, E27.016, 257/E27.112

See application file for complete search history.

(56) References Cited

U.S. PATENT DOCUMENTS

| | | | |
|---|---|---|---|
| 4,578,695 A | 3/1986 | Delaporte | |
| 6,191,442 B1 | 2/2001 | Matsufusa | |
| 7,064,414 B2 * | 6/2006 | Aitken et al. | 257/537 |
| 2004/0129977 A1 * | 7/2004 | Ohkubo et al. | 257/347 |
| 2005/0287718 A1 * | 12/2005 | Berndlmaier et al. | 438/149 |
| 2006/0163635 A1 * | 7/2006 | Aitken et al. | 257/300 |

FOREIGN PATENT DOCUMENTS

| | | |
|---|---|---|
| EP | 0725407 | 1/1996 |
| JP | 60-128651 | 9/1985 |
| JP | 2003-297931 | 10/2003 |

* cited by examiner

*Primary Examiner*—T. N. Quach
(74) *Attorney, Agent, or Firm*—Harness, Dickey & Pierce, P.L.C.

(57) ABSTRACT

A semiconductor device with a plurality of passive components (7,7a,8,8a) comprising a bottom substrate (1), a buried oxide layer (2) on a portion of the top surface of the bottom substrate (1), an dielectric intermediate insulating layer (3) on a portion of the buried oxide layer (2), a dielectric top insulating layer (4), and at least one implanted passive component (7a,8a) of a semiconductor material implanted under the buried oxide layer (2) within the top surface portion of the bottom substrate (1), the implanted semiconductor material having a material polarity being opposite to the bottom substrate polarity. When the implanted passive component (7a) is an AC decoupling capacitor (7a), the bottom and side portions of the implanted semiconductor material are surrounded by a depletion layer (7b) of a semiconductor material implanted between said bottom substrate (1) and said implanted semiconductor material.

13 Claims, 4 Drawing Sheets

A

B

C

D

E

F

A

B

C

D

E

F

SEMICONDUCTOR DEVICE COMPRISING AN INTEGRATED CIRCUIT

TECHNICAL FIELD OF THE INVENTION

The present invention lies within the field of semiconductor devices comprising integrated circuits. More particularly, the invention pertains to the sector of semiconductor devices comprising passive components such as resistors, inductors, capacitors etc. being part of electric circuits integrated in semiconductor devices.

BACKGROUND OF THE INVENTION

Semiconductor devices comprising integrated circuits like microchips are of widespread application in electronics such as computer hardware. Miniaturization of the components of the integrated circuits is a critical issue i.e. it is essential to pack the greatest possible amount of components in a microchip. Typical components are transistors, and so-called passive components such as resistors, inductors and capacitors.

A typical conventional structure of semiconductor devices is comprised of a bottom substrate having a top surface and a bottom substrate polarity, a silicon on insulator (SOI) layer portions on a buried oxide (BOX) layer that is deposited on at least a portion of the top surface of the bottom substrate, a top insulating layer over the SOI layer portions, and top metal connecting elements connected to said passive components by conductors extending through via holes. The transistors and passive components are located in the layers deposited over the BOX layer i.e. the SOI and a top silicon dioxide and/or polysilicon layer.

Transistors are an essential part of microchips and it has become possible to reduce the size thereof deeply down to the submicron range. It is however difficult to reduce the size of the passive components to a level being comparable to the size reduction achieved for transistors so that the presence of such passive components limits that layout space available for designing the integrated circuits on the microchips having the above described typical structure.

This conventional structure of microchips thus has the drawback of limiting the possibility of a larger amount integrating components in a semiconductor device of a given size. The disadvantage of this drawback is that it leads to a limit in miniaturization that is conditioned by the sizes and amount of passive components and thereby to relatively large chip sizes when the space needed for the amount of passive components required for an application is larger than the layout space available.

These disadvantages are a boundary to cost efficiency of conventional microchips.

DESCRIPTION OF THE INVENTION

The present invention is intended to overcome the afore mentioned drawbacks and disadvantages by providing a semiconductor device comprising an integrated circuit with a plurality of passive components selected from capacitors, inductors and resistors, the semiconductor device comprising a bottom substrate having a top surface portion and a bottom substrate polarity, a buried oxide ('BOX') layer on at least a portion of the top surface of the bottom substrate, at least one dielectric intermediate insulating layer on at least a portion of the buried oxide layer, a dielectric top insulating layer, top metal connecting elements connected to said passive components by conductors extending through via holes, and at least one of the passive components being formed of at least one silicon on insulator ('SOI') layer portion embedded within at least one of said insulating layers;

wherein at least one further passive component is an implanted passive component of at least one implanted semiconductor material implanted under the buried oxide layer within the top surface portion of the bottom substrate, and said implanted semiconductor material has a material polarity being opposite to the bottom substrate polarity.

By providing the implanted passive components, such as capacitors, resistors and inductors within the top surface portion of the substrate, said portion is converted into an extra layout layer so that efficiency of the layout space is improved without a need to increase the chip size inasmuch the silicon on insulator layer becomes available for providing other passive or active components.

In accordance with the invention, the semiconductor device may be made of materials that are per se known in the art. Thus, the bottom substrate may be of semiconductor material such as silicon, GaAs, InP, etc. and preferably of n-(As, P) or p-type (B) doped silicon material, the BOX layer may be of a low-leakage dielectric i.e. insulating material and may be a silicon dioxide;

the SOI layer portion may be of a silicon material such as n- or p-type doped silicon material, heavily doped silicon material or lightly doped silicon material;

the implanted semiconductor material between electrode parts, when used for forming a capacitor, may be selected from dielectric materials and materials having high permittivity, such for example silicon dioxide or silicon nitride, whilst the electrode parts thereof may be made from a conductive material selected from metals such as aluminum, copper, high conductivity materials, such as poly- and single-crystal silicon, or aluminum, copper and silicon alloys;

the implanted semiconductor material, when used for forming a resistor, may be semiconductor material, such as n- or p-type silicon or p- or n-type polysilicon, the resistance of which may be adjusted by doping the material;

the conductors extending through the via holes are of a very conductive material as for example metals such as tungsten, aluminum, titanium and alloys comprising these metals;

the top metal connecting elements also are of a very conductive material having low resistivity such as metals such as copper, tungsten, aluminum, and alloys thereof, and preferably of copper or aluminum or alloys of these metals, and copper when the integrated circuit is of silicon.

In an embodiment of the semiconductor device of the present invention the bottom substrate is of a p-type semiconductor material such as Boron the BOX layer is of silicon dioxide, the top metal connecting elements are made of a material selected from copper, aluminum or an alloy of these metals, the implanted passive component below the BOX layer is of n-type semiconductor material.

In a further embodiment of the semiconductor device of the present invention the bottom substrate is of a n-type semiconductor material, selected from Arsenic and Phosphorus, the BOX layer is of silicon dioxide, the top metal connecting elements are made of a material selected from copper, aluminum or an alloy of these metals, the implanted passive component below the BOX layer is of p-type semiconductor material.

In an embodiment of the invention that is especially suitable for AC decoupling capacitors as passive components, the bottom and side portions of the implanted semiconductor material are surrounded by a depletion layer implanted between said bottom substrate and said implanted semiconductor material. AC decoupling capacitors are usually rather large when compared to other passive components, so that implanting AC decoupling capacitors in accordance with the present invention greatly reduces the need of layout space inasmuch the space needed by such capacitors in conventional semiconductor devices may be used for placing other active and/or passive components. The p-n junction between the bottom substrate and the implanted semiconductor material forms the depletion layer in boundary between p-type material of the bottom substrate and the n-type implanted semiconductor material. The width of the depletion layer depends on the doping concentration of each material. The depletion layer is of a semiconductor material and may be for example of silicon, Gallium Arsenide, or other suitable material for forming a p-n junction, and is preferably of silicon. When silicon material is used, the depletion layer should be silicon.

Like plate capacitors, the decoupling capacitors implanted in accordance with the present invention further have very low parasitic resistance to expand, when the material polarity of the implanted semiconductor material is n, the n+ layer, not only near the contact area but also in the contact-to-contact area, so that also an improved performance of the so-implanted decoupling capacitors is achieved.

In an embodiment of the invention
the bottom substrate is of p-type Silicon (p-Si);
the dielectric intermediate insulating layer is of Silicon Dioxide ($SiO_2$);
the dielectric top insulating layer is of Silicon Dioxide ($SiO_2$);
the depletion layer is of Silicon (Si);
the silicon on insulator layer portions are each of n-type or p-type Silicon (p-Si, n-Si);
the implanted AC decoupling capacitor below the BOX layer is of n-Silicon; and
the implanted resistor is of n-Silicon.

As readily apparent from the foregoing description, the present invention provides a semiconductor device comprising integrated circuits, in which the layout space is enlarged without increase of the chip size and the chip cost.

BRIEF DESCRIPTION OF THE DRAWINGS

Features of the invention will now be described on the grounds of some drawings, in which.

Figure 1:
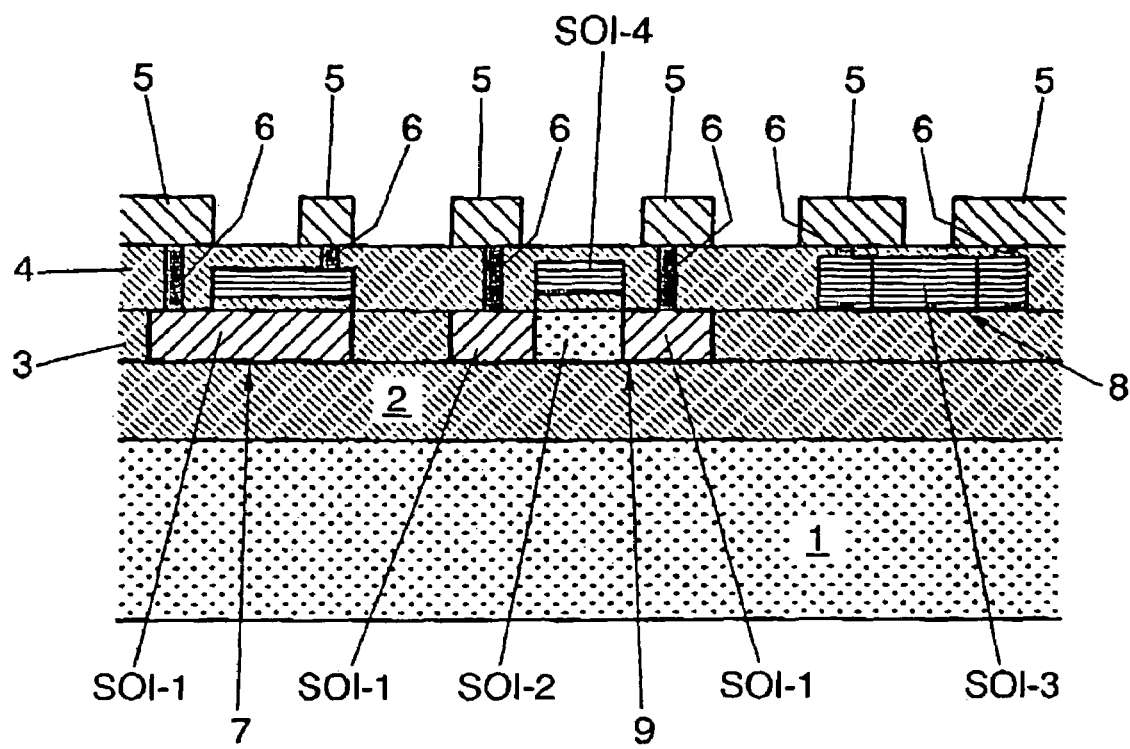
FIG. 1 is a partial schematic sectional view of a prior art semiconductor device.
Figure 1:
Figure 1:
Figure 1:
Figure 1:
Figure 1:
Figure 1:

In these figures, there appear reference signs having the following meanings:
1 bottom substrate
2 BOX layer
3 dielectric intermediate insulating layer
4 dielectric top insulating layer
5 top metal connecting elements
6 via hole
7 capacitor
7a capacitor implanted below BOX layer (AC decoupling capacitor)
7b depletion layer
8 resistor
8a resistor below BOX layer
9 transistor
SOI-1, SOI-2, SOI-3, SOI-4 silicon on insulator ('SOI') layer portions In the figures, elements drawn with the same pattern are of the same type of basic material, namely
A p-semiconductor
B conductive metal of top connecting elements
C silicon dioxide
D polysilicon
E conductive metal in via holes
F n-semiconductor

DESCRIPTION OF EMBODIMENTS OF THE INVENTION

Before referring to some embodiments of the semiconductor device of the present invention, it seems appropriate to describe the main structural features of a prior art semiconductor device from which the present invention has departed. Thus, as shown in FIG. 1, a typical prior art semiconductor device comprises an integrated circuit comprising a bottom substrate 1 of a p-type semiconductor material. A BOX layer 2 of silicon dioxide is deposited on at least a portion of the top surface of the bottom substrate 1 and a dielectric intermediate insulating layer 3 of silicon dioxide on a portion of the BOX layer 2. On the intermediate insulating layer 3, there is a dielectric top insulating layer 4 of silicon dioxide. Embedded within the intermediate insulating layer 3 and the top insulating layer 4, there are a capacitor 7 comprised of an n-type semiconductor material and polysilicon, and transistor 9 (such as a SOI NMOS FET) comprised of n-semiconductor material, p-semiconductor material and polysilicon. Further a resistor 8 comprised of polysilicon is embedded within the top insulating layer 4. The respective poles of each of the capacitor 7, and transistor 9 and a resistor 8 are connected with top metal connecting elements 5 by conductors that extend through via holes 6. As apparent, the need of placing the passive elements in the insulating layers 3,4 requires a rather substantial horizontal extension of the semiconductor device.

The components of the capacitor 7, the resistor 8 and the transistor 9 are formed from various silicon on insulator layer portions (SOI-1, SOI-2, SOI-3, SOI-4) provided during the manufacturing process in an per se conventional manner.

Figure 2:
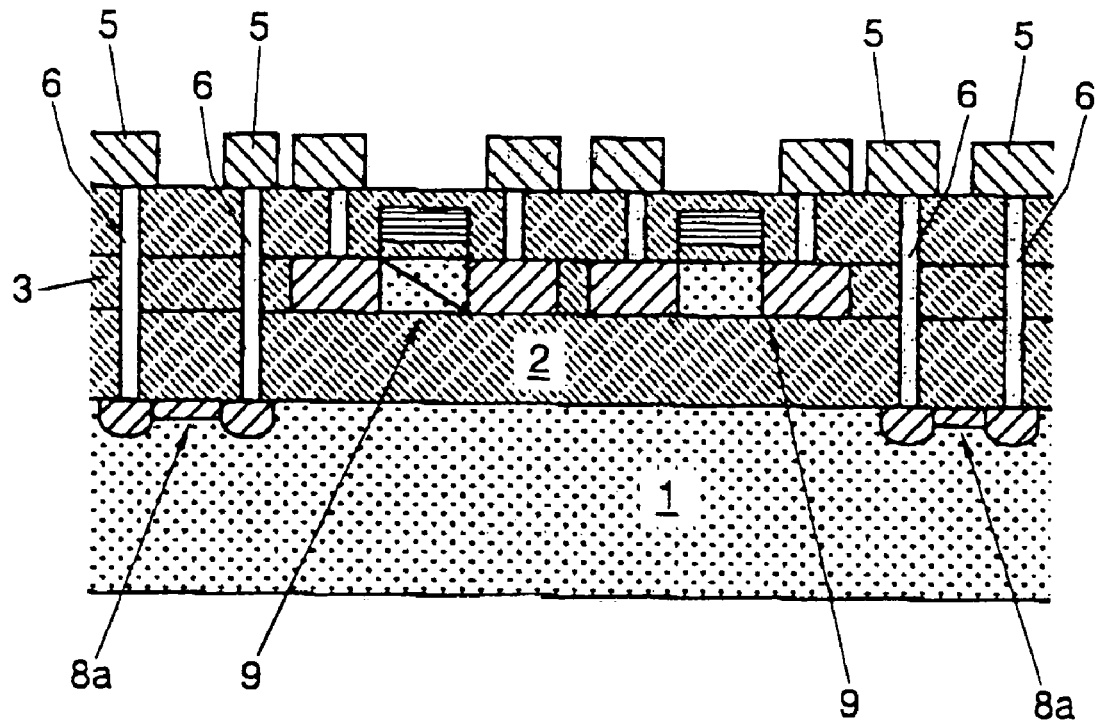
FIG. 2 is a partial schematic sectional view of the a semiconductor device in accordance with a first embodiment.
Figure 2:
Figure 2:
Figure 2:
Figure 2:
Figure 2:
Figure 2:

In the first embodiment of the present invention shown in FIG. 2, two resistors 8a are implanted in the top surface portion of the bottom substrate 1 below the BOX layer 2. The resistors 8a are connected to the top metal connecting elements 5 of copper in a per se conventional manner by means of conductors of copper that extend through via holes 6. The positions of the implanted resistors 8a in the top surface portion of the bottom substrate 1 leave sufficient space for two transistors 9 between the resistors 8a to be placed conventionally in the insulating layers 3,4. The respective poles of each of the transistors 9 are connected with the corresponding top metal connecting elements 5 by further conductors that extend through additional via holes 6.

Figure 3:
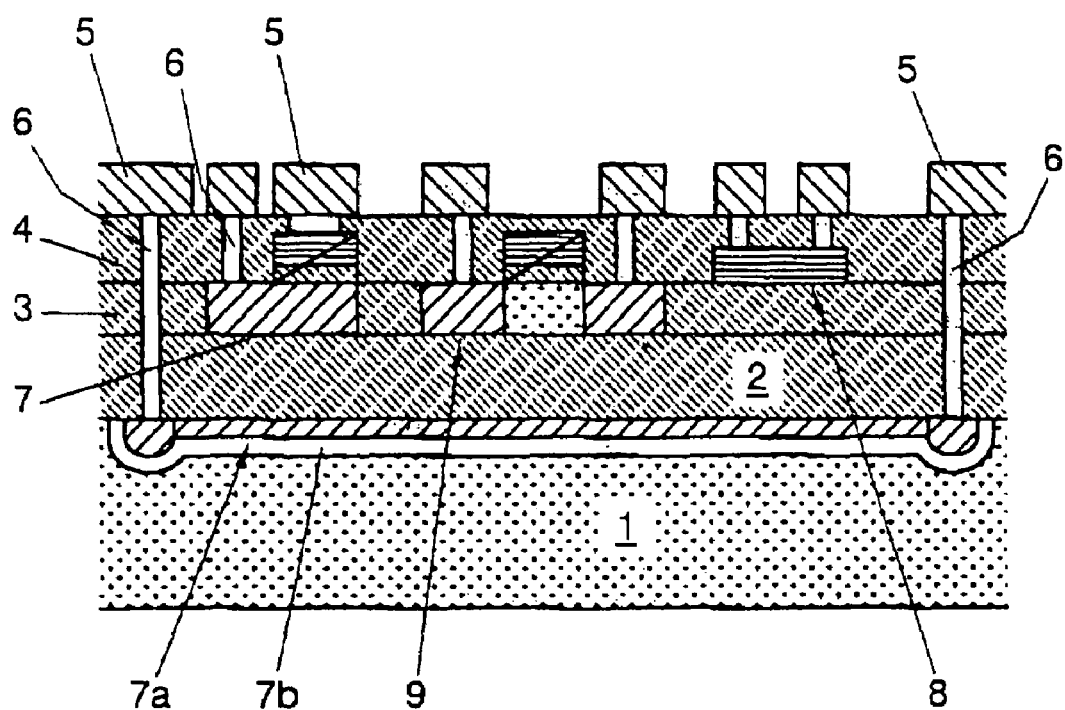
FIG. 3 is a partial schematic sectional view of the a semiconductor device in accordance with a second embodiment.
Figure 3:
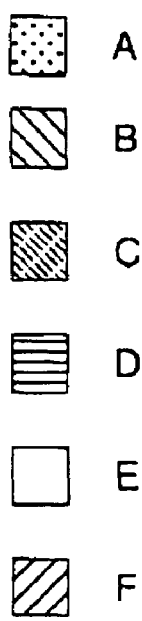

In the second embodiment of the present invention shown in FIG. 3, a first capacitor 7 a transistor 9 and a resistor 8 are located within the insulating layers 3,4 in a conventional manner. However, an AC decoupling capacitor 7a is provided below the BOX layer 2 within a top surface portion of the bottom substrate 1. A depletion layer 7b surrounds the bottom and lateral portions of the AC decoupling capacitor 7a. Again, the respective poles of each of the capacitors 7,7a, the resistor 8 and the transistor 9 are connected with the pertinent top metal connecting elements 5 by conductors that extend through additional via holes 6.

In this second embodiment, the increase of the layout space for components enabled by the present invention becomes especially clear inasmuch, if the AC decoupling capacitor 7a were conventionally placed in one or both of the insulating layers 3,4, it would require the whole horizontal extension that, in accordance with the invention, may however be occupied by the first capacitor 7, the transistor 9 and the resistor 8.

Figure 4:
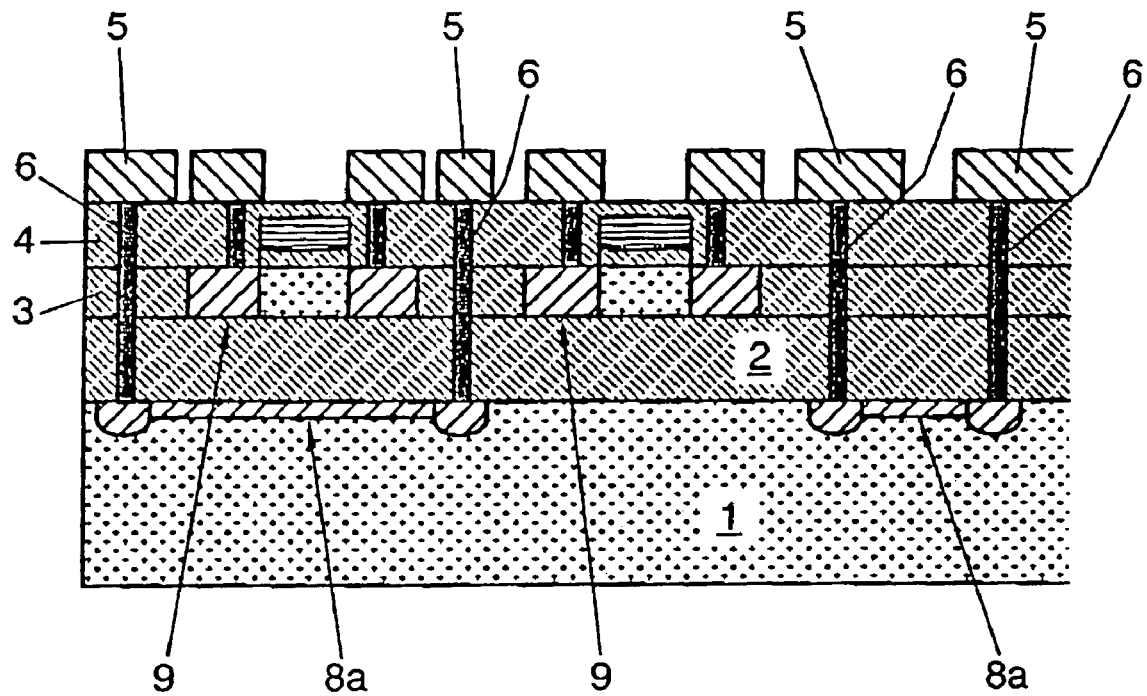
FIG. 4 is a partial schematic sectional view of the a semiconductor device in accordance with a third embodiment.
Figure 4:
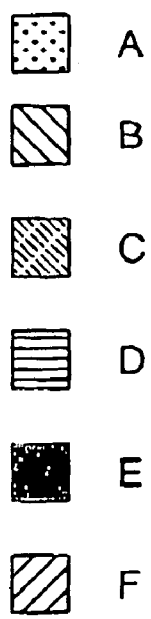

The third embodiment of the present invention shown in FIG. 4 comprises two transistors 9 conventionally placed in the insulating layers 3,4 and two implanted resistors 8 located within the top surface portion of the bottom substrate 1. The first, right-hand transistor 9 is located between the via holes 6 of the right-hand implanted resistor 8 whilst the second transistor is located between the right-hand and the left-hand resistors 8. Also in this third embodiment, the respective poles of each of the resistors 8 and the transistor 9, are connected with the pertinent top metal connecting elements 5 by conductors that extend through additional via holes 6.

In the embodiments of the invention shown in FIGS. 2, 3 and 4
- the bottom substrate 1 is of p-type Silicon (p-Si)
- the dielectric intermediate insulating layer 3 is of Silicon Dioxide ($SiO_2$)
- the dielectric top insulating layer 4 is of Silicon Dioxide ($SiO_2$)
- the depletion layer 7b is of Silicon (Si)
- the SOI-1, SOI-2, SOI-3, SOI-4 SOI layer portions are of n-type or p-type Silicon (p-Si, n-Si)
- the implanted AC decoupling capacitor 7a below the BOX layer is of n-Silicon
- the implanted resistor 8a is of n-Silicon As readily apparent, the present invention allows to gain a rather substantial amount of layout space for components of the circuit integrated in the semiconductor device, thereby allowing to reduce the size of a semiconductor device for a given number of components of an integrated circuit, or to increase the number of components that may be placed in a semiconductor device of a given size.

The invention claimed is:

1. A semiconductor device comprising an integrated circuit comprising a plurality of passive components selected from capacitors and resistors, the semiconductor device comprising
    a bottom substrate having a top surface portion and a bottom substrate polarity,
    a buried oxide layer deposited on at least a portion of the top surface of the bottom substrate,
    at least one dielectric intermediate insulating layer on at least a portion of the buried oxide layer,
    a dielectric top insulating layer,
    top metal connecting elements connected to said passive components by conductors extending through via holes,
    at least one of the passive components being formed of at least one silicon on insulator layer portion embedded within at least one of said insulating layers;
    wherein
    at least one further passive component is an implanted passive component of at least one implanted semiconductor material implanted under the buried oxide layer within the top surface portion of the bottom substrate,
    said implanted semiconductor material has a material polarity being opposite to the bottom substrate polarity.

2. A semiconductor device according to claim 1, wherein the top insulating layer is located on at least a portion of said intermediate insulating layer.

3. A semiconductor device according to claim 1, wherein the implanted passive component is selected from implanted capacitors and implanted resistors.

4. A semiconductor device according to claim 1, comprising a plurality of implanted passive components.

5. A semiconductor device according to claim 1, further comprising at least one transistor embedded in said insulating layers.

6. A semiconductor device according to claim 1, further comprising at least one capacitor embedded in said insulating layers.

7. A semiconductor device according to claim 1, wherein
    the bottom substrate is of a p-type semiconductor material; and
    the implanted passive component below the buried oxide layer is of an n-type semiconductor material.

8. A semiconductor device according to claim 1, wherein
    the bottom substrate is of a n-type semiconductor material; and
    the implanted passive component below the buried oxide layer is of a p-type semiconductor material.

9. A semiconductor device according to claim 1, wherein
    the buried oxide layer and the insulating layers are of silicon dioxide,
    each silicon on insulator layer portion is of a doped silicon material.

10. A semiconductor device according to claim 1, wherein the implanted passive component is an AC decoupling capacitor, and wherein the bottom and side portions of the implanted semiconductor material are surrounded by a depletion layer implanted between said bottom substrate and said implanted semiconductor material.

11. A semiconductor device according to claim 10, wherein the depletion layer is of a semiconductor material.

12. A semiconductor device according to claim 10, wherein the depletion layer is selected from the group consisting of silicon and Gallium Arsenide.

13. A semiconductor device according to claim 10, wherein the depletion layer is of silicon.

* * * * *